United States Patent
Mouli

(10) Patent No.: US 7,663,165 B2
(45) Date of Patent: Feb. 16, 2010

(54) TRANSPARENT-CHANNEL THIN-FILM TRANSISTOR-BASED PIXELS FOR HIGH-PERFORMANCE IMAGE SENSORS

(75) Inventor: Chandra Mouli, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 587 days.

(21) Appl. No.: 11/513,242

(22) Filed: Aug. 31, 2006

(65) Prior Publication Data

US 2008/0054319 A1 Mar. 6, 2008

(51) Int. Cl.
*H01L 27/148* (2006.01)
*H01L 29/768* (2006.01)

(52) U.S. Cl. .................. 257/215; 257/223; 257/E27.13

(58) Field of Classification Search .................. 257/214, 257/215, 216, 232, 233, E27.13, E27.133
See application file for complete search history.

(56) References Cited

U.S. PATENT DOCUMENTS

| | | | |
|---|---|---|---|
| 4,954,895 A | 9/1990 | Akimoto et al. | |
| 6,140,630 A | 10/2000 | Rhodes | |
| 6,204,524 B1 | 3/2001 | Rhodes | |
| 6,310,366 B1 | 10/2001 | Rhodes | |
| 6,326,652 B1 | 12/2001 | Rhodes | |
| 6,333,205 B1 | 12/2001 | Rhodes | |
| 6,376,868 B1 | 4/2002 | Rhodes | |
| 6,380,572 B1 | 4/2002 | Pain et al. | |
| 7,115,923 B2 * | 10/2006 | Hong | 257/290 |
| 7,388,248 B2 | 6/2008 | Basceri et al. | |
| 2005/0145900 A1 | 7/2005 | Rhodes | |
| 2005/0205930 A1 | 9/2005 | Williams, Jr. | |
| 2005/0269606 A1 | 12/2005 | Mouli | |
| 2005/0274988 A1 | 12/2005 | Hong | |
| 2006/0001059 A1 | 1/2006 | Mouli et al. | |
| 2006/0001060 A1 | 1/2006 | Rhodes | |
| 2006/0006436 A1 | 1/2006 | Mouli | |
| 2006/0054945 A1 | 3/2006 | Mouli | |
| 2006/0060753 A1 | 3/2006 | Rhodes | |
| 2006/0071290 A1 | 4/2006 | Rhodes | |

FOREIGN PATENT DOCUMENTS

| | | |
|---|---|---|
| EP | 0 708 554 | 4/1996 |
| FR | 2 888 989 | 1/2007 |

OTHER PUBLICATIONS

International Search Report (6 pages), Apr. 2005.
Written Opinion (8 pages), Apr. 2005.
"Transparent Thin-Film Transistors with Zinc Indium Oxide Channel Layer," Journal of Applied Physics 97 (2005), (3 pages).

(Continued)

*Primary Examiner*—Hoai v Pham
(74) *Attorney, Agent, or Firm*—Dickstein Shapiro LLP

(57) ABSTRACT

A pixel circuit, and method of forming a pixel circuit, an imager device, and a processing system include a photo-conversion device, a floating diffusion region for receiving and storing charge from the photo-conversion device, and a transparent transistor for use in operation of the pixel, wherein the transparent transistor is at least partially over the photo-conversion device, such that the photo-conversion device receives light passing through the transparent transistor.

53 Claims, 10 Drawing Sheets

OTHER PUBLICATIONS

"Transparent Electronics and Prospects for Transparent Displays," J. F. Wager, et al., Proceedings of SPIE, vol. 5080 (2003) (5 pages).
"Building Hybrid Active Pixels for CMOS Imager on SOI Substrate," 1999 IEEE International SOI Conference, Oct. 1999 (1 page).
Parker, I.D., Carrier Tunneling and Device Characteristics in Polymer Light-Emitting Diodes, J. Appl. Phys., vol. 75, No. 3, Feb. 1, 1994.

Ganzorig, Chimed, et al., Fine Tuning Work Function of Indium Tin Oxide by Surface Molecular Design: Enhanced Hole Injection in Organic Electroluminescent Devices, Appl. Phys. Lett., vol. 79, No. 2, Jul. 9, 2001.
Young, David L. et al., Growth and Characterization of Radio Frequency Magnetron Sputter-Deposited Zinc Stannate, $Zn_2SnO_4$, Thin Films, J. Appl. Phys, vol. 92, No. 1, Jul. 1, 2002.

* cited by examiner

TRANSPARENT-CHANNEL THIN-FILM TRANSISTOR-BASED PIXELS FOR HIGH-PERFORMANCE IMAGE SENSORS

FIELD OF THE INVENTION

Disclosed embodiments relate to the field of semiconductor devices, particularly to image sensors using thin film technology.

BACKGROUND OF THE INVENTION

Typically, an image sensor array includes a focal plane array of pixels, each one of the pixels including a photo-conversion device such as, e.g., a photogate, photoconductor, or a photodiode. FIG. 1A illustrates a cross section of a portion of a conventional CMOS imager pixel 100 having a pinned photodiode 114 as its photo-conversion device. FIG. 1B illustrates the entire pixel 100 circuit in schematic form. The photodiode 114 is adjacent to an isolation region 110, which is depicted as a shallow trench isolation (STI) region. The photodiode 114 includes an n-type region 115 underlying a p+ surface layer 116.

The photodiode 114 converts photons to charge carriers, e.g., electrons, which are transferred to a floating diffusion region 140 by a transfer transistor 119. In addition, the illustrated pixel 100 typically includes a reset transistor 121, connected to a source/drain region 136, for resetting the floating diffusion region 140 to a predetermined level (shown as $V_{aapix}$) prior to charge transference. In operation, a source follower transistor 142 (FIG. 1B) outputs a voltage representing the charge on the floating diffusion region 140 to a column line 150 (FIG. 1B) when a row select transistor 152 (FIG. 1B) for the row containing the pixel 100 is activated.

CMOS image sensor circuits, processing steps thereof, and detailed descriptions of the functions of various CMOS elements of an image sensor circuit are described, for example, in U.S. Pat. No. 6,140,630, U.S. Pat. No. 6,376,868, U.S. Pat. No. 6,310,366, U.S. Pat. No. 6,326,652, U.S. Pat. No. 6,204,524, and U.S. Pat. No. 6,333,205, assigned to Micron Technology, Inc. The disclosures of each of the forgoing patents are herein incorporated by reference in their entirety.

In the conventional pixel 100, when incident light strikes the surface of the photodiode 114, charge carriers (electrons), are generated in the depletion region of the p-n junction (between region 115 and region 116) of the photodiode 114.

As can be seen from FIGS. 1A and 1B, CMOS sensors typically use several transistors in every pixel for various functions including amplification. Although FIGS. 1A and 1B describe a four transistor (4T) design, pixel circuits are also known which have fewer, (e.g., 3T), as well as more (e.g., 5T, 6T, etc.) transistors. As pixel size is scaled down in high-resolution sensors, the area taken by these transistors and corresponding interconnects becomes significant and reduces the pixel area available for the photo-conversion device. Photo-conversion device area should be made as large as possible to increase imager sensitivity and quantum efficiency.

In addition, there are several imaging applications that require high quantum efficiency, small pixels, and have unique wavelength requirements, such as shorter visible wavelengths and ultraviolet light. Increasing the size of the photo-conversion device area is particularly important in such cases.

DETAILED DESCRIPTION OF THE INVENTION

Figure 1A:
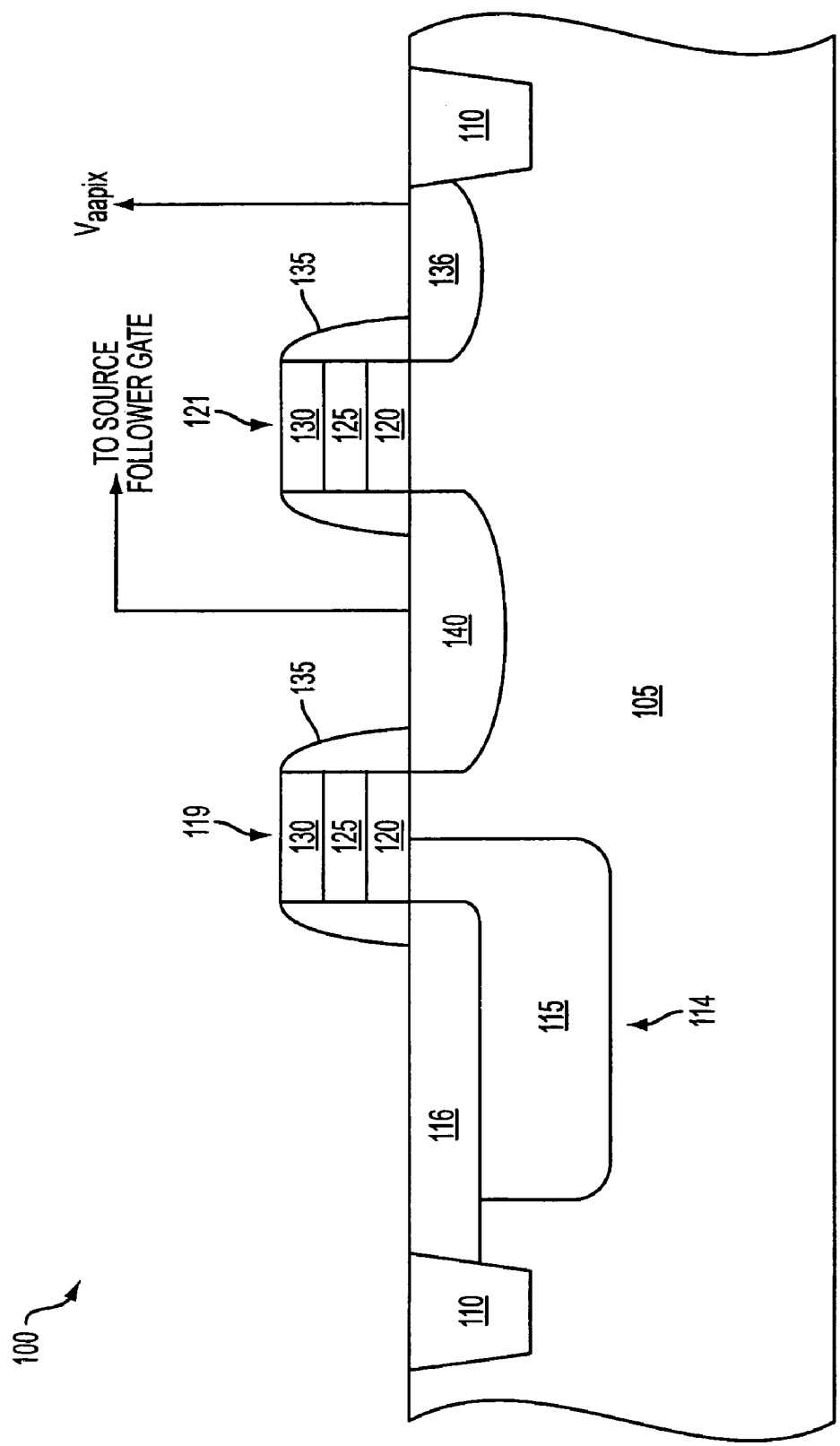
FIG. 1A illustrates a cross-sectional view of a portion of a conventional imager pixel circuit.
Figure 1B:
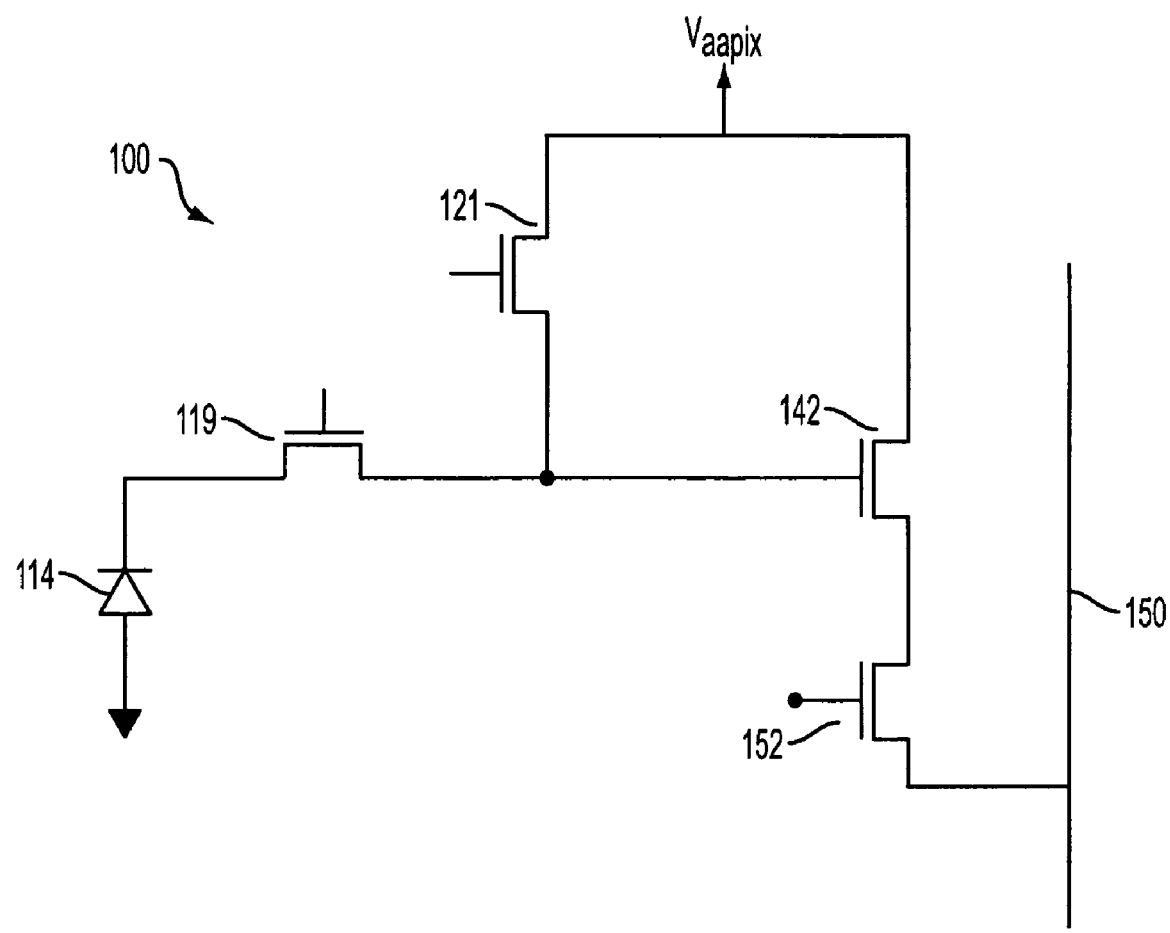
FIG. 1B illustrates a schematic view of a conventional imager pixel circuit.

In the following detailed description, reference is made to the accompanying drawings, which form a part hereof and show by way of illustration specific embodiments in which the invention may be practiced. These embodiments are described in sufficient detail to enable those skilled in the art to practice them, and it is to be understood that other embodiments may be utilized, and that structural, logical, processing, and electrical changes may be made. The progression of processing steps described is an example; however, the sequence of steps is not limited to that set forth herein and may be changed as is known in the art, with the exception of steps necessarily occurring in a certain order.

The terms "wafer" and "substrate," as used herein, are to be understood as including silicon, silicon-on-insulator (SOI) or silicon-on-sapphire (SOS) technology, doped and undoped semiconductors, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photosensor and associated transistors for converting photons to an electrical signal. For purposes of illustration, a single representative pixel and its manner of formation is illustrated in the figures and description herein; however, typically fabrication of a plurality of like pixels proceeds simultaneously. Accordingly, the following detailed description is not to be taken in a limiting sense, and the described embodiments are defined only by the appended claims.

The term "transparent," as used herein, to be understood as including embodiments using translucent materials.

The disclosed embodiments relate to a pixel circuit including a photo-conversion device, a floating diffusion region for receiving and storing charge from the photo-conversion device, and a transparent thin-film pixel transistor, which can be formed at least partially over the photo-conversion device while allowing image light to pass therethrough to the photo-conversion device. The thin-film transistor may be used as a substitute for one or more conventional pixel transistors, such as a source follower transistor, reset transistor, row select transistor, anti-blooming transistor, if used, etc., and is particularly useful as a transfer transistor for delivering stored charge from the photo-conversion device to the floating diffusion region. Methods of forming the pixel circuit are also disclosed.

The active semiconductor material of semiconductor-on-insulator (SOI) technologies will typically be formed as a thin film over an insulating material (typically oxide), with thicknesses of the semiconductor film being, for example, less than or equal to 2000 Å. In contrast, bulk semiconductor material will typically have a thickness of at least about 200 microns. The thin semiconductor of SOI technology can allow higher performance and lower power consumption to be achieved in integrated circuits than can be achieved with similar circuits utilizing bulk materials.

An integrated circuit device that can be formed utilizing SOI technologies includes a so-called thin film transistor (TFT), with the term "thin film" referring to the thin semiconductor film of the SOI construction. In particular, the semiconductor material of the SOI construction can be silicon, and, as such, the TFTs can be fabricated using recrystallized amorphous silicon or polycrystalline silicon. The silicon can be supported by an electrically insulative material (such as silicon dioxide), which in turn is supported by an appropriate substrate. If the semiconductor material comprises silicon, the term SOI is occasionally utilized to refer to a silicon-on-insulator construction, rather than the more general concept of a semiconductor-on-insulator construction. However, it is to be understood that in the context of this disclosure the term SOI refers to semiconductor-on-insulator constructions. Accordingly, the semiconductor material of an SOI construction referred to in the context of this disclosure can comprise other semiconductive materials in addition to, or alternatively to, silicon.

Figure 2:
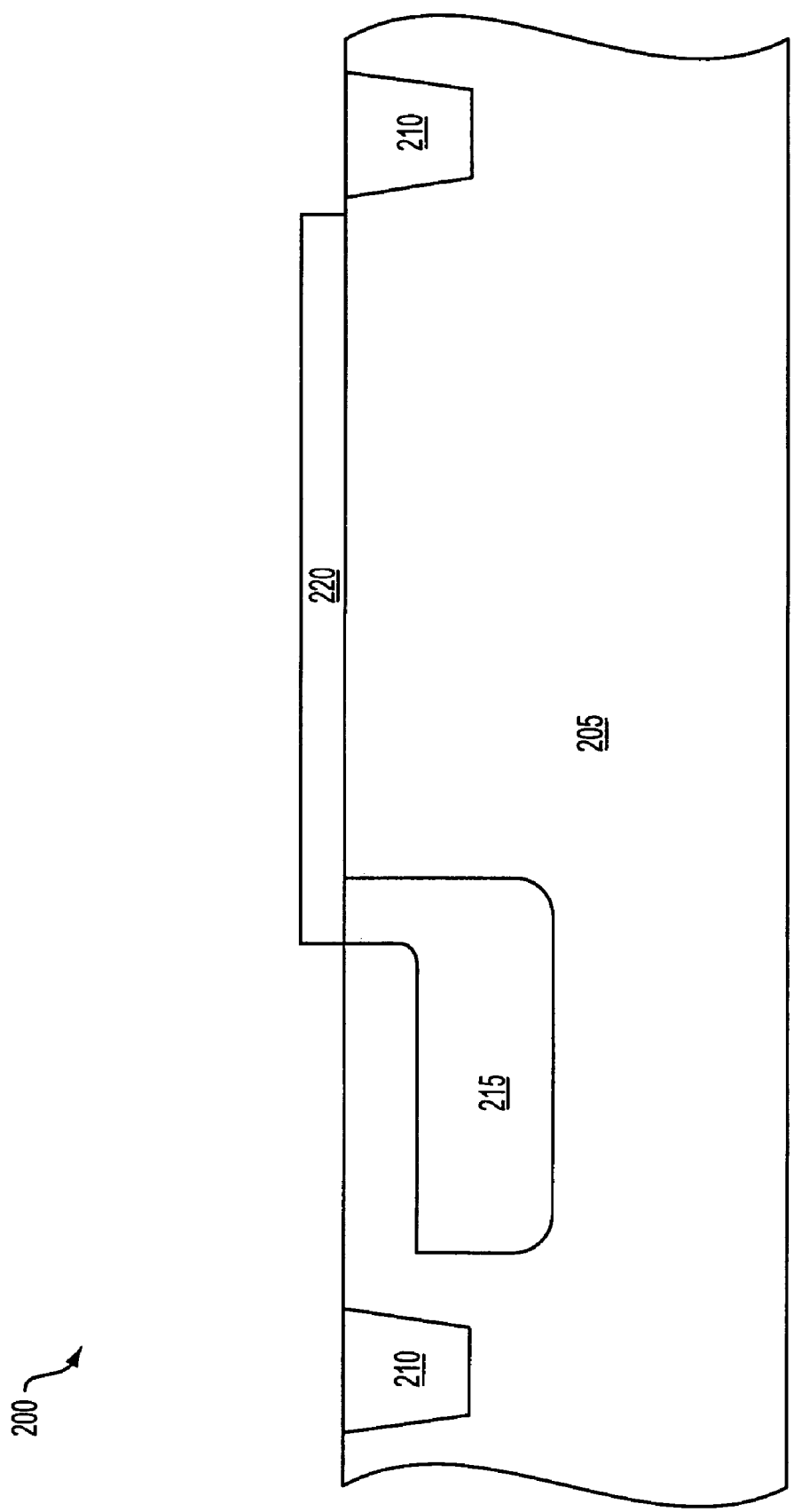
FIG. 2 illustrates a cross-sectional view of an initial stage of formation of an imager pixel circuit constructed in accordance with a first embodiment.

Now referring to the figures, where like numerals designate like elements, FIG. 2 illustrates a cross-sectional view of an initial stage of formation of an imager pixel circuit 200 constructed in accordance with one embodiment where the transistor formed is a transfer transistor for a pixel circuit. The pixel circuit 200 includes a silicon (Si) substrate 205 of a first conductivity type; an STI region 210, which is formed in the substrate 205 and surrounds and isolates a pixel. The STI region 210 is filled with a dielectric material. A doped region 215 of a second conductivity type is formed in the substrate 205, and which will become part of a photo-conversion device 214 (FIG. 3) and a silicon dioxide ($SiO_2$) layer 220 is formed on the substrate 205, for example, by a strip/regrow process. In this example, photo-conversion device 214 (FIG. 3) is a pinned photodiode. Also in this example, the first conductivity type is p-type, and the second conductivity type is n-type. Typically, photo-conversion device 214 (FIG. 3) may extend into the substrate 205 to a depth of about 1 μm.

Figure 3:
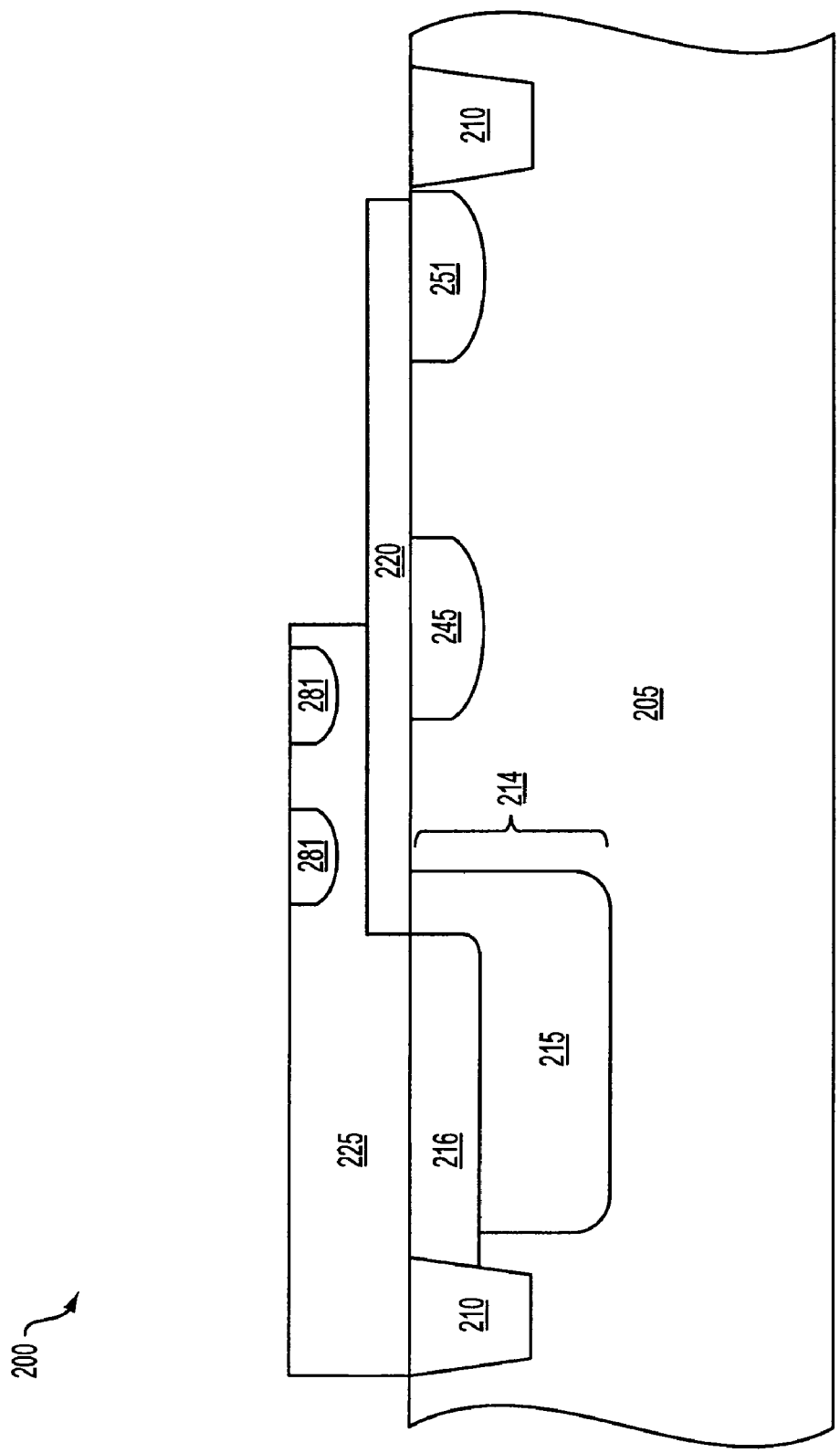
FIG. 3 illustrates a cross-sectional view of a subsequent stage of formation of an imager pixel circuit, subsequent to what is illustrated in FIG. 2.

FIG. 3 illustrates a cross-sectional view of a subsequent stage of formation of the imager pixel circuit 200. A doped surface layer 216 for a photo-conversion device 214 is implanted. Doped surface layer 216 is doped to the first conductivity type. Illustratively, doped surface layer 216 is a highly doped p+ surface layer and is formed to a depth of approximately 0.1 μm. A p-type dopant, such as boron, indium, or any other suitable p-type dopant, may be used to form the p+ surface layer 216. A layer of zinc tin oxide (ZTO) 225 is formed over a portion of the STI region 210, doped regions 215, 216, and part of $SiO_2$ layer 220. The ZTO layer 225 is transparent to visible high-frequency light at short wavelengths and near ultraviolet, as well as to all visible wavelengths, and is a semiconductor material which will form an effective second selectively conductive channel for a transfer transistor 219 (FIG. 6), as discussed below. Optionally, the p-type dopant may be incorporated into the ZTO layer 225 during deposition (in-situ doped ZTO) or afterward.

ZTO thin films have broad direct optical band gap characteristic in the range of 3.3 to 3.9 eV. This is due to a large Burstein-Moss shift in this material. The Burstein-Moss effect is conduction band filling with an increased free electron concentration. ZTO also has useful properties, including chemical stability with respect to oxidation and etching, and physical robustness. Carrier mobility in ZTO is one of the best among known transparent metallic oxides, and therefore high ratios of on and off currents are possible with ZTO, relative to other transparent metallic oxide gate material based transistors. Part of the ZTO layer 225 is used as a channel region for a transistor of the pixel. Source/drain regions 281 can be formed in the ZTO layer 225 by conventional doping, preferably with very low Schottky barriers. Alternatively, source/drain regions 281 can be formed on the ZTO layer 225 by direct metal deposition.

Figure 4:
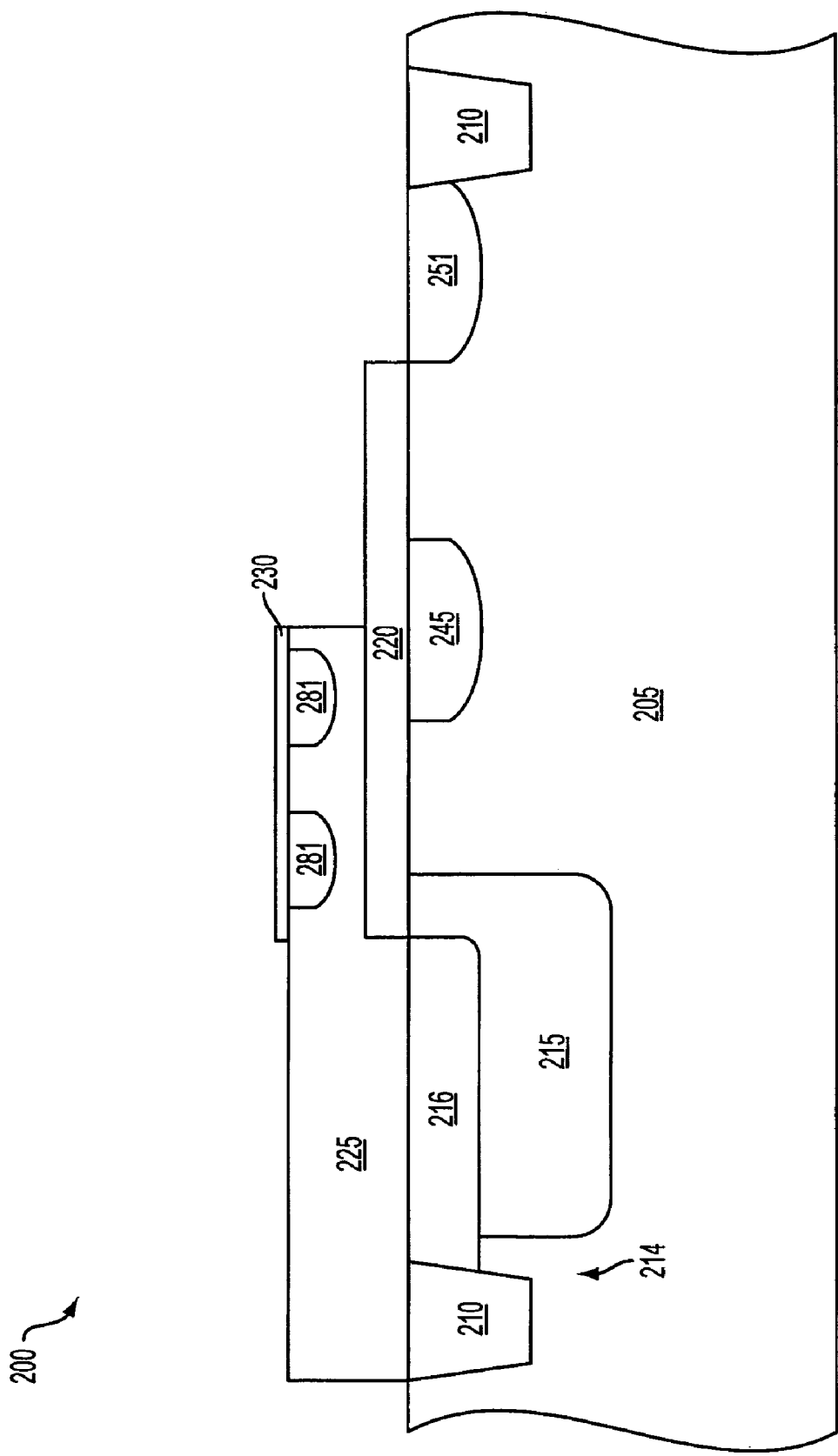
FIG. 4 illustrates a cross-sectional view of a subsequent stage of formation of an imager pixel circuit, subsequent to what is illustrated in FIG. 3.

FIG. 4 illustrates a cross-sectional view of a subsequent stage of formation of the imager pixel circuit 200. A transparent dielectric layer 230 is formed over part of ZTO layer 225. Dielectric layer 230 is typically constructed of a material such as aluminum oxide ($Al_2O_3$), titanium oxide, or atomic layer deposition silicon dioxide (ALD $SiO_2$).

Figure 5:
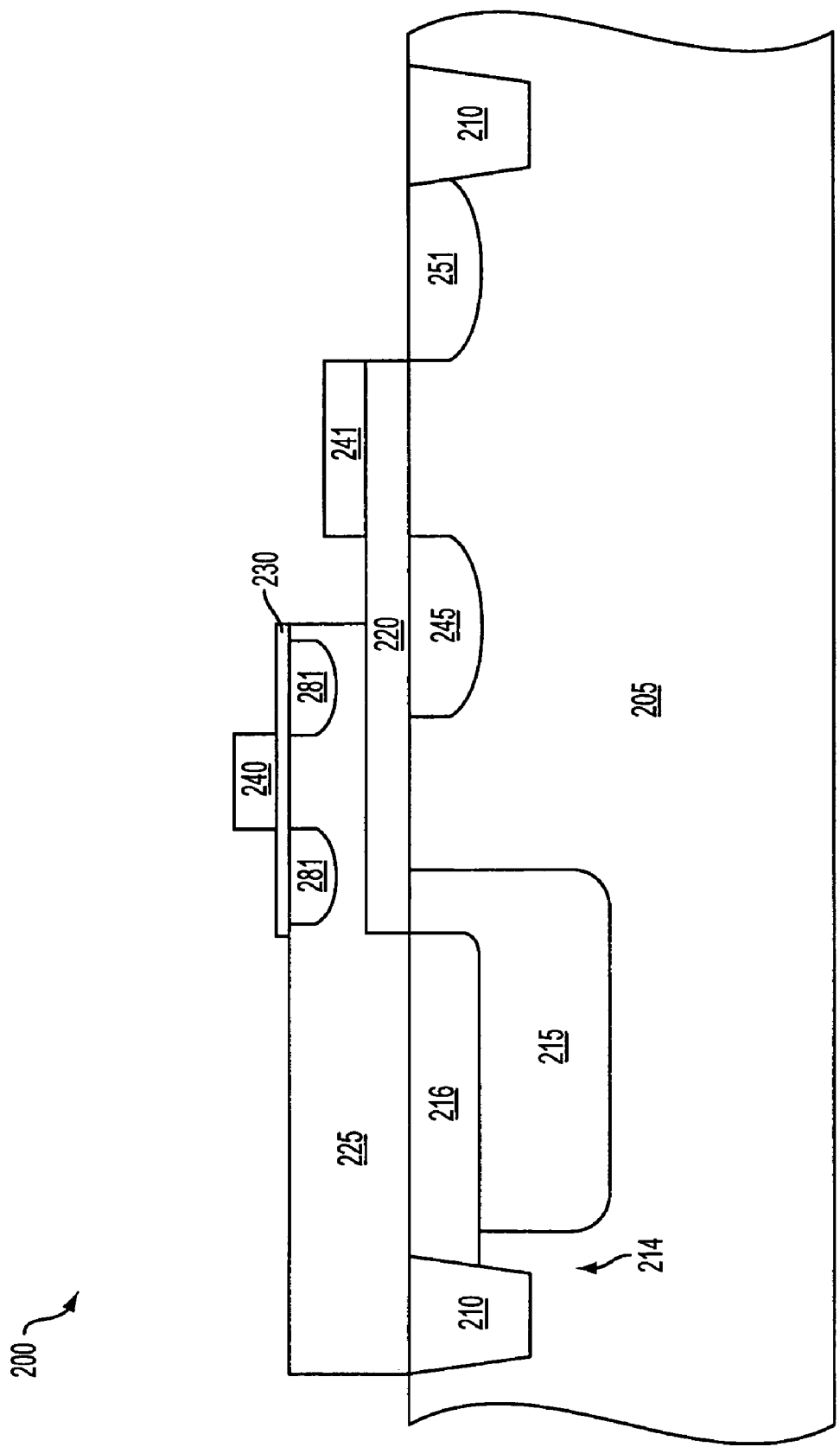
FIG. 5 illustrates a cross-sectional view of a subsequent stage of formation of an imager pixel circuit, subsequent to what is illustrated in FIG. 4.

FIG. 5 illustrates a cross-sectional view of a subsequent stage of formation of the imager pixel circuit 200. A transfer gate electrode 240 is formed over at least part of dielectric layer 230. A reset gate electrode 241 for reset transistor 221 is formed over part of the $SiO_2$ layer 220. The transfer gate electrode 240 may be any suitable conductive material, preferably one that is transparent to radiant energy, including but not limited to doped polysilicon or a transparent material such as indium tin oxide (ITO). The transfer gate electrode 240 may cover part or all of the dielectric layer 230. The use of a transparent materials for transfer transistor 219 allows transfer transistor 219 (FIG. 6) to be directly placed over at least a portion of photo-conversion device 214 It may also be placed entirely over the photo-conversion device 214, providing drastic improvement in fill factor and quantum efficiency. Embodiments include a thickness range of about 100 Å to 2500 Å for ZTO layer 225, about 50 Å to 300 Å for dielectric layer 230, and about 500 Å to 1000 Å for transfer gate electrode 240. The thickness of ZTO layer 225 may be altered for different applications. For example, thinner to reduce absorption loss, and thicker for planarization. "Fill factor" is a measure of the size of a light sensitive region in a photodiode relative to the surface area of the pixel. In Active Pixel Sensor (APS) technology, each pixel includes transistors that form active circuits.

Generally, these transistors are not light sensitive regions and therefore reduce the fill factor of a pixel since they take space (surface area) which otherwise could be used for increasing the area of the photodiode.

A floating diffusion region 245 and a source/drain region 251 of the reset transistor 221 (FIG. 6) may be implanted by known methods, including a plasma-assisted doping (PLAD) process. The floating diffusion region 245 and source/drain region 251 of the reset transistor 221 are formed as regions of the second conductivity type, which, in this example, is n-type. Any suitable n-type dopant, such as phosphorus, arsenic, or antimony, may be used. The floating diffusion region 245 is formed between the transfer transistor 219 (FIG. 6) gate stack and the reset transistor 221 gate stack. The source/drain region 251 of the reset transistor 221 is formed between the reset transistor 221 and the second STI region 210. The floating diffusion region 245 stores charge collected from the photo-conversion device 214, through a first channel between doped region 215 and the floating diffusion region 245, under the $SiO_2$ layer 220, which functions as a dielectric.

Figure 6:
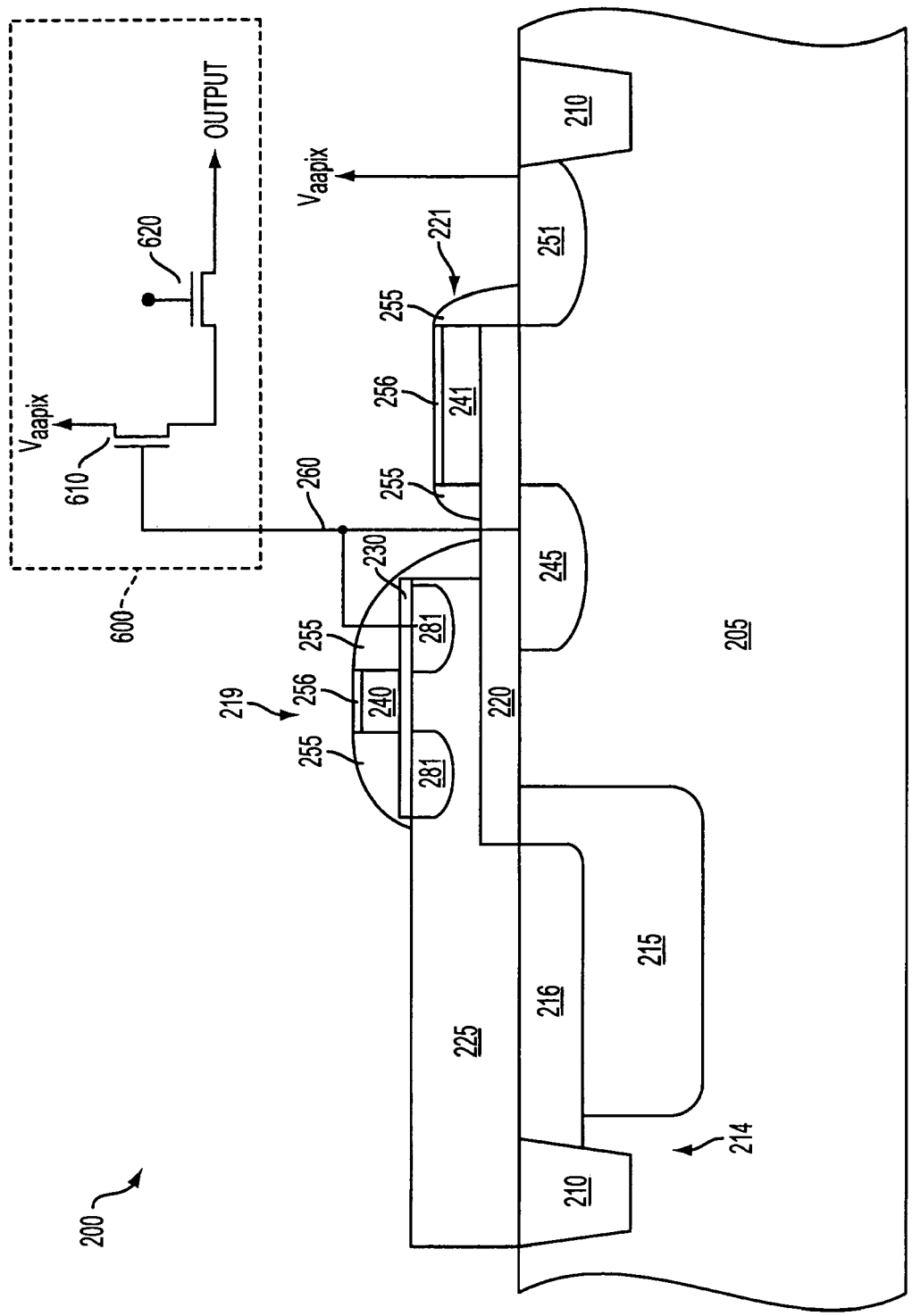
FIG. 6 illustrates a cross-sectional view of a subsequent stage of formation of an imager pixel circuit, subsequent to what is illustrated in FIG. 5.

FIG. 6 illustrates a cross-sectional view of a subsequent stage of formation of the imager pixel circuit 200 constructed in accordance with the described embodiments. The transfer transistor 219 gate stack includes, at this point, the $SiO_2$ layer 220, the ZTO layer 225, the dielectric layer 230, and the transfer gate electrode 240. The reset transistor 221 gate stack includes, at this point, the $SiO_2$ layer 220, and the reset gate electrode 241. Sidewalls 255 and a top cap layer 256 are formed on each gate stack, typically by an oxide growth, followed by, for example, a dry etch process or by material deposition and etch back. A source/drain region 281 in ZTO layer 225 is connected to the floating diffusion region 245 through several possible schemes, enabling the ZTO layer 225 to function as a second channel for the transfer transistor 219. Such schemes include (1) an interconnect process through metallization and contacts connecting floating diffusion region 245 to line 260; (2) a local interconnect process using silicidation; and (3) butted contact connecting floating diffusion region 245 to line 260 through a conducting spacer. Therefore, transfer transistor 219 has two channels that function to transfer charge from photo-conversion device 214 upon application of a gate control signal on gate electrode 240: the region of substrate 205 between doped region 215 and the floating diffusion region 245, and the ZTO layer 225 between source/drain regions 281. Charge collected in the photo-conversion device 214 may reach the ZTO layer 225 by carrier drift, as an electric field exists in ZTO layer 225, or through diffusion (for, e.g., red photons). The source/drain region 251 of the reset transistor 221 is connected to a pixel supply voltage $V_{aapix}$, enabling reset transistor 221 to reset the floating diffusion region 245.

A readout circuit 600 (shown in schematic form) is connected to the floating diffusion region 245 via line 260. The readout circuit 600 includes a source follower transistor 610, having a gate connected to the floating diffusion region 245 through line 260, and a first source/drain region connected to the pixel supply voltage $V_{aapix}$. The readout circuit 600 also includes a row select transistor 620 for selecting the pixel 200 for readout in response to a signal received at the gate of the row select transistor 620. The row select transistor 620 has a first source/drain region connected to a second source/drain region of the source follower transistor 610, and a second source/drain region connected to an array column output line.

The embodiment illustrated provides a transparent thin film transistor (TFT) for the transfer transistor which may be provided partially or wholly over the photo-conversion device 214. Conventional processing methods may be used to complete the pixel 200. For example, insulating, shielding, and metallization layers to connect gate lines, and other connections to the pixel 200 may be formed. Also, the entire surface may be covered with a passivation layer (not shown) of, for example, silicon dioxide, BSG, PSG, or BPSG, which is CMP planarized and etched to provide contact holes, which are then metallized to provide contacts. Conventional layers of conductors and insulators may also be used to interconnect the structures and to connect pixel 200 to peripheral circuitry.

In addition, other transistors within a pixel circuit may also be constructed in the manner described above for the transfer transistor 219. Using the illustrated four transistor pixel shown in FIG. 6, any one or more of the transfer transistor 219, reset transistor 221, source follower transistor 610 and row select transistor 620 may be constructed as a TFT in the manner illustrated in the embodiment with respect to transistor elements 225, 230, 240, 255, 256, 281, and be provided partially or wholly over the photo-conversion device 214.

Figure 6A:
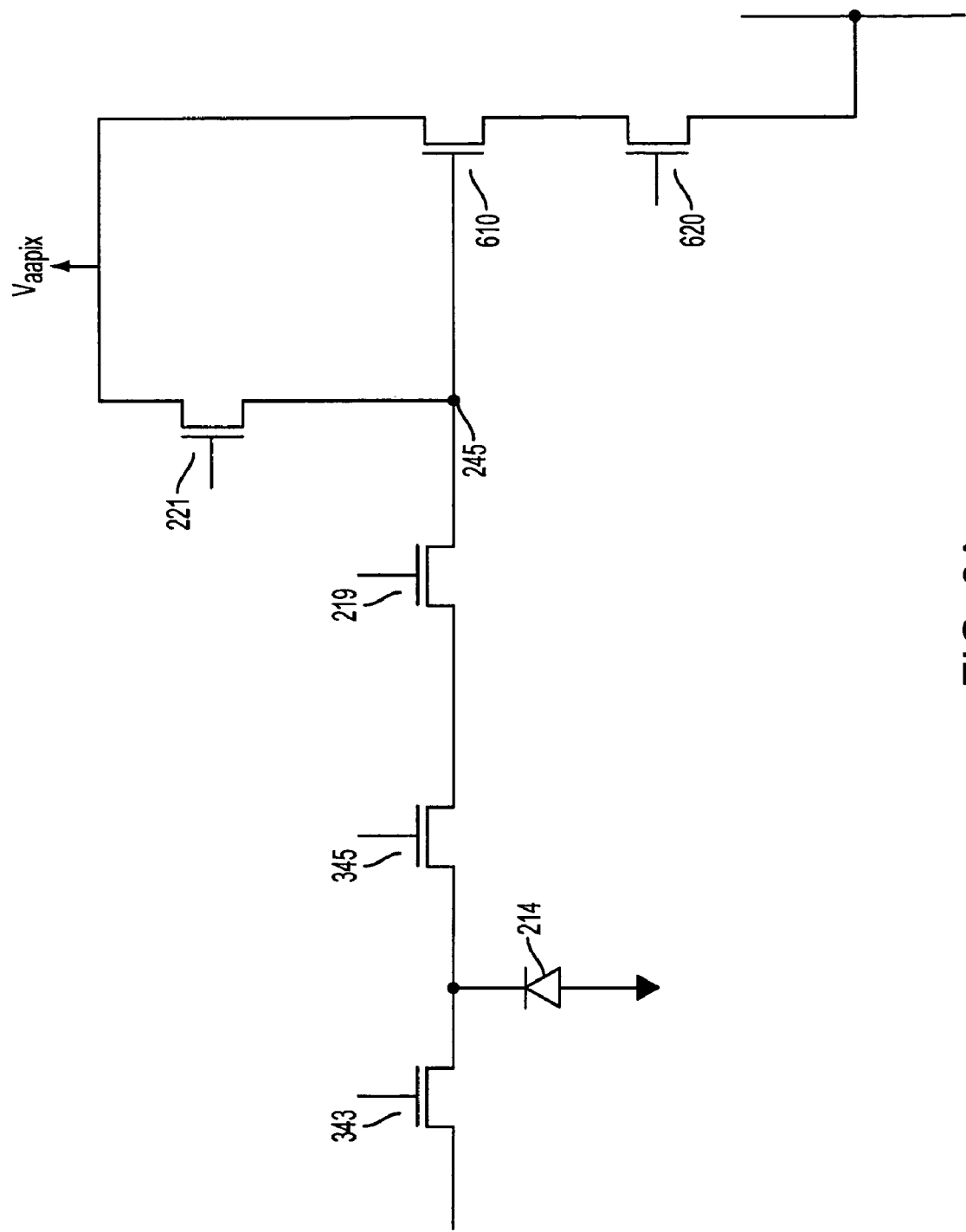
FIG. 6A illustrates in schematic form another embodiment.

Also, the embodiments may be employed in pixels having fewer or more transistors than illustrated in FIG. 6. As should be apparent, any or all of the pixel transistors may be constructed as described above with respect to transfer transistor 219. For example, as illustrated in FIG. 6A, some pixels employ an anti-blooming transistor 343 and/or storage gate transistors 345, which are coupled to the photo-conversion device 214. These, too, may be formed as TFT transistors in the manner described above, and be placed partially or wholly over the photo-conversion device 214. The described embodiments increase the fill factor by having transistors which are transparent to visible light and/or to high-frequency and near ultra-violet light, formed over at least a portion of the photo-conversion device 214, and improves the quantum efficiency in scaled pixels. Embodiments include less than 10% signal loss due to scattering, although, amounts of translucency may be offset by gains of other means, such as increased fill factor.

Thin, transparent TFT channels are constructed on silicon-dioxide films for specific transistors in the pixel. The channel region is made out of transparent material so that they can be directly placed on top of photo-conversion devices, such as a photo-conversion device 214, enabling improvement in fill factor and quantum efficiency. There are also embodiments in which only a part of the transistor is transparent, including parts other than the gate stack. Techniques exist which may increase transmission (i.e., reduce loss in film) in ITO and ZTO materials. Typically, changing the stoichiometry of the constituent elements in these films may change the transmission coefficient. Also, by incorporating rare-earth elements, such as erbium, optical loss can be reduced further. There are also other techniques, such as placing anti-reflective (AR) films on top of the ITO or ZTO layer to reduce reflections at the top interface.

Figure 7:
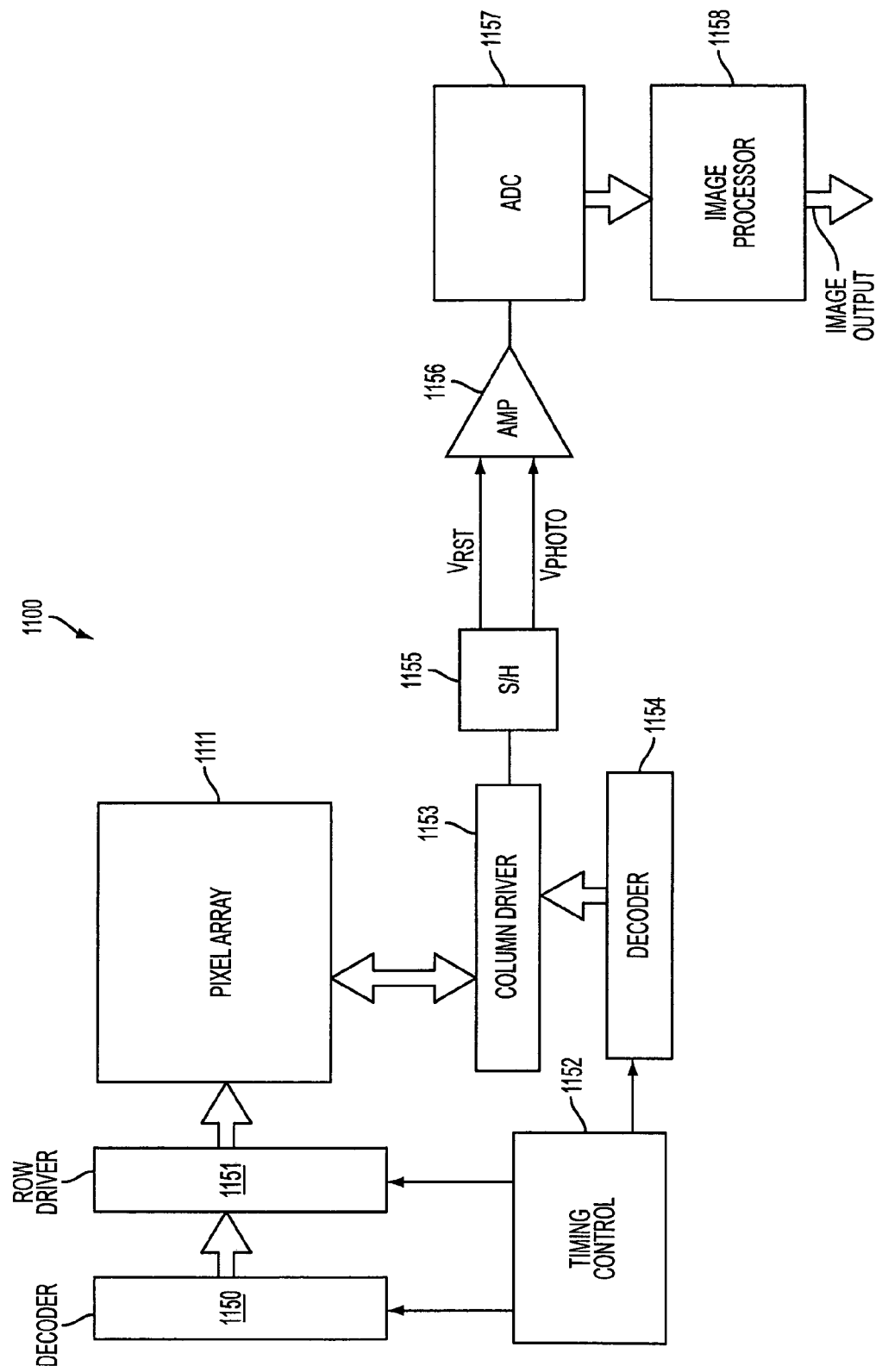
FIG. 7 illustrates a block diagram of an image sensor according to an embodiment.

As illustrated in FIG. 7, pixels constructed in accordance with the embodiments may be formed as part of an image sensor having a array of pixels. FIG. 7 illustrates a single chip CMOS image sensor 1100 which has a pixel array 1111 containing a plurality of pixel cells arranged in rows and columns. The array 1111 includes one or more pixels 200 constructed as described above in connection with FIGS. 2-6A.

The pixels of each row in array 1111 are all turned on at the same time by a row select line, and the pixel signals of each column are selectively output onto column readout lines by respective column select lines. The row lines are selectively activated by a row driver 1151 in response to row address decoder 1150. The column select lines are selectively activated by a column driver 1153 in response to column address decoder 1154. The pixel array is operated by the timing and control circuit 1152, which controls address decoders 1150, 1154 for selecting the appropriate row and column lines for pixel signal readout.

The signals on the column readout lines typically include a pixel reset signal ($V_{rst}$) and a pixel image signal ($V_{photo}$) for each pixel. Both signals are read into a sample and hold circuit (S/H) 1155 associated with the column driver 1153. A differential signal ($V_{rst}$-$V_{photo}$) is produced by differential amplifier (AMP) 1156 for each pixel, and each pixel's differential signal is amplified and digitized by analog-to-digital converter (ADC) 1157. The analog-to-digital converter 1157 supplies the digitized pixel signals to an image processor 1158, which performs appropriate image processing before outputting digital signals defining an image. Although the embodiments are described in connection with a CMOS image sensor 1100, the embodiments are also applicable to analogous structures of a charge coupled device (CCD) image sensor.

Figure 8:
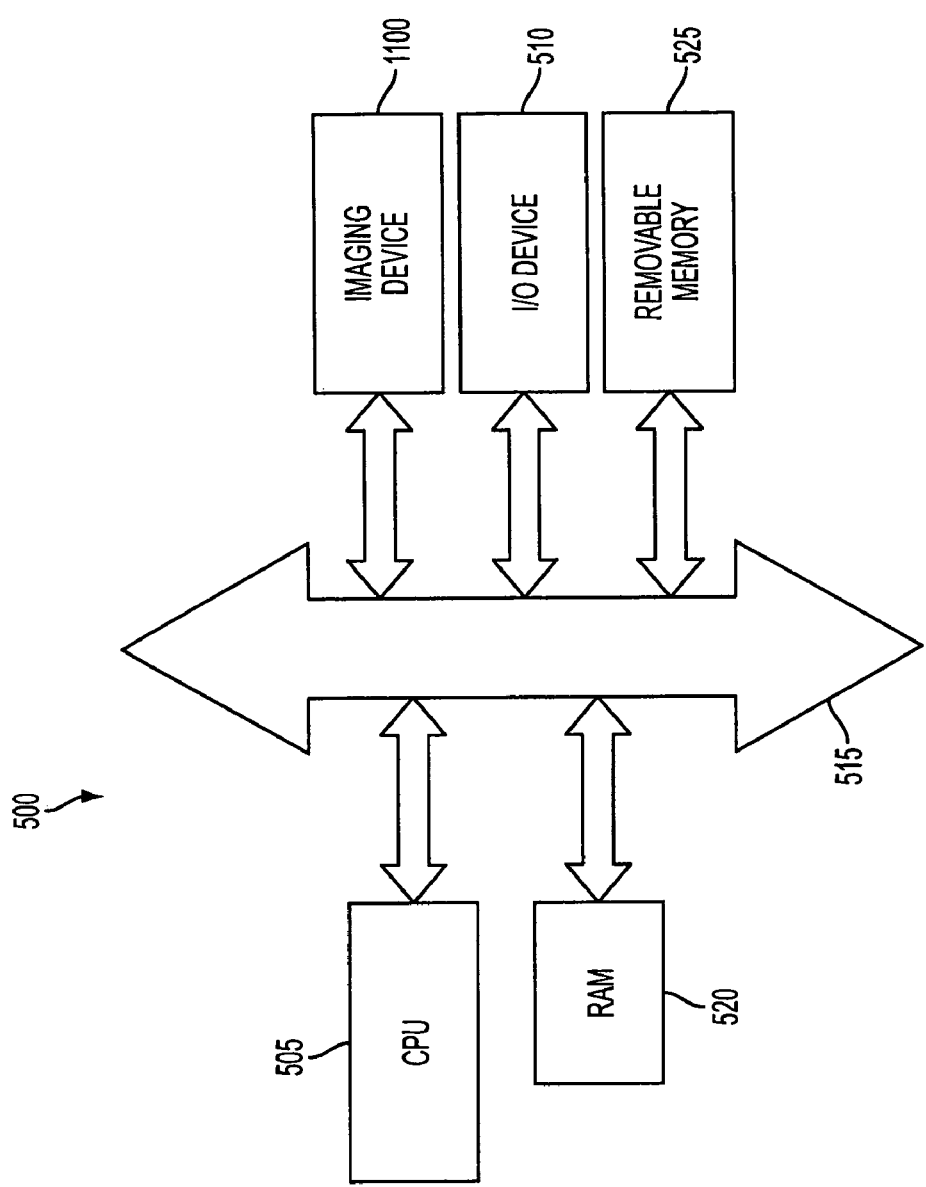
FIG. 8 illustrates a processing system utilizing an image sensor incorporating the imager pixel circuit of the described embodiments.

FIG. 8 illustrates a processor system 500, for example a still or video camera system, which generally comprises a central processing unit (CPU) 505, such as a microprocessor for controlling camera functions, that communicates with one or more input/output (I/O) devices 510 over a bus 515. Imager 1100 also communicates with the CPU 505 over bus 515. The system 500 also includes random access memory (RAM) 520, and can include removable memory 525, such as flash memory, which also communicate with CPU 505 over the bus 515. Imager 1100 may be combined with a processor, such as a CPU, digital signal processor, or microprocessor, with or without memory storage on a single integrated circuit or on a different chip than the processor.

The processor system 500 is an example of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

While the above embodiments are described in connection with the formation of an pnp-type pinned photodiode, the embodiments are not limited thereto. There is also applicability to other types of photo-conversion devices or photosensors for charge generation, such as a photodiode formed from np or npn regions in a substrate, a photogate, or a photoconductor. If an npn-type photodiode is formed the dopant and conductivity types of all structures would change accordingly. In addition, although the embodiments have been illustrated in the environment of a four transistor (4T) pixel, it should be appreciated that the embodiments are not so limited and the pixel circuit 200 can be implemented in a design with either a higher or lower number of transistors with or without the presence of a transfer transistor. The embodiments may also be used in pixels of other solid state arrays.

The processes and devices in the above description and drawings illustrate examples of methods and devices of many that could be used and produced to achieve the objects, features, and advantages of embodiments described herein. For example, the described embodiments may be used in a digital camera, a video camera, or any other device employing image pixels. Thus, they are not to be seen as limited by the foregoing description of the embodiments, but only limited by the appended claims.

What is claimed as new and desired to be protected by Letters Patent of the United States is:

1. A pixel circuit comprising:
   a photo-conversion device;
   a floating diffusion region for receiving and storing charge from the photo-conversion device; and
   a transparent transistor for use in operation of the pixel, wherein the transparent transistor is at least partially over the photo-conversion device, such that the photo-conversion device receives light passing through the transparent transistor.

2. The pixel circuit of claim 1, wherein the transparent transistor comprises a transfer transistor, the transfer transistor operable to deliver stored charge from the photo-conversion device to the floating diffusion region.

3. The pixel circuit of claim 2, wherein the transfer transistor comprises first and second channel regions for passing charge through the transfer transistor.

4. The pixel circuit of dam 2, further comprising:
   a reset transistor for resetting the floating diffusion region to a predetermined reset voltage state;
   a readout circuit for reading out a signal based on charges stored at the floating diffusion region and the first capacitance circuit;
   a source follower transistor coupled to the floating diffusion region; and
   a row select transistor acting as a switching device coupled to the source follower transistor.

5. The pixel circuit of claim 1, wherein the transparent transistor comprises a reset transistor, the reset transistor operable to reset the floating diffusion region to a predetermined reset voltage state.

6. The pixel circuit of claim 1, wherein the transparent transistor comprises a source follower transistor, the source follower transistor coupled to the floating diffusion region.

7. The pixel circuit of claim 1, wherein the transparent transistor comprises a row select transistor, the row select transistor acting as a switching device coupled to a source follower transistor.

8. The pixel circuit of claim 1, wherein the transparent transistor comprises an anti-blooming transistor for preventing charge overflow from the photo-conversion device.

9. The pixel circuit of claim 1, wherein the transparent transistor comprises a storage gate transistor.

10. The pixel circuit of claim 1, wherein the transparent transistor comprises a thin-film transistor.

11. The pixel circuit of claim 1, wherein the transparent transistor comprises a transistor channel, the transistor channel comprising zinc-tin oxide.

12. The pixel circuit of claim 11, wherein the transparent transistor further comprises a gate dielectric, the gate dielectric comprising aluminum oxide ($Al_2O_3$).

13. The pixel circuit of claim 11, wherein the transparent transistor further comprises a gate dielectric, the gate dielectric comprising titanium oxide.

14. The pixel circuit of claim 11, wherein the transparent transistor further comprises a gate dielectric, the gate dielectric comprising atomic layer deposition silicon dioxide (ALD $SiO_2$).

15. The pixel circuit of claim 11, wherein the transparent transistor further comprises a gate electrode, the gate electrode comprising indium tin oxide.

16. The pixel circuit of claim 1, wherein the photo-conversion device comprises a photodiode.

17. A pixel circuit comprising:
   a photodiode;
   a floating diffusion region for receiving and storing charge from the photodiode; and
   a transparent transfer transistor for transferring charge from the photo-conversion device to the floating diffusion region,
   wherein the transparent transfer transistor is at least partially over the photodiode, such that the photodiode receives light passing through the transparent transistor.

18. The pixel circuit of claim 17, wherein the transparent transfer transistor comprises:
   a first channel region, the channel comprising zinc-fin oxide; and a gate electrode, the gate electrode comprising indium tin oxide.

19. The pixel circuit of claim 18, wherein the transparent transfer transistor comprises a second channel region, the second channel comprising silicon.

20. An imager device comprising:
an array of pixel circuits, at least some of the pixel circuits comprising:
a photodiode;
a floating diffusion region for receiving and storing charge from the photodiode; and
a transparent transistor for use in operation of the pixel, the transparent transistor being at least partially over the photodiode, such that the photodiode receives light passing through the transparent transistor; and
a readout circuit for reading out a signal based charges in the floating diffusion region.

21. The imager device of claim 20, wherein the transparent transistor comprises a transfer transistor, the transfer transistor operable to deliver stored charge from the photodiode to the floating diffusion region.

22. The imager device of claim 21, wherein the transfer transistor comprises first and second channel regions for passing charge through the transfer transistor.

23. The imager device of claim 20, wherein the transparent transistor comprises a reset transistor, the reset transistor operable to reset the floating diffusion region to a predetermined reset voltage state.

24. The imager device of claim 20, wherein the transparent transistor comprises a source follower transistor, the source follower transistor coupled to the floating diffusion region.

25. The imager device of claim 20, wherein the transparent transistor comprises a row select transistor, the row select transistor acting as a switching device coupled to a source follower transistor.

26. The imager device of claim 20, wherein the transparent transistor comprises an anti-blooming transistor for preventing charge overflow from the photo-conversion device.

27. The imager device of claim 20, wherein the transparent transistor comprises a storage gate transistor.

28. The imager device of claim 20, wherein the transparent transistor comprises a tin-film transistor.

29. The imager device of claim 20, wherein the transparent transistor comprises a transistor channel, the transistor channel comprising zinc-tin oxide.

30. The imager device of claim 29, wherein the transparent transistor further comprises a gate dielectric, the gate dielectric comprising aluminum oxide ($Al_2O_3$).

31. The imager device of claim 29, wherein the transparent transistor further comprises a gate dielectric, the gate dielectric comprising titanium oxide.

32. The imager device of claim 29, wherein the transparent transistor further comprises a gate dielectric, the gate dielectric comprising atomic layer deposition silicon dioxide (ALD $SiO_2$).

33. The imager device of claim 29, wherein the transparent transistor further comprises a gate electrode, the gate electrode comprising indium tin oxide.

34. The imager device of claim 20, wherein the photo-conversion device comprises a photodiode.

35. A processing system comprising:
a processor; and
an imager device comprising:
an array of pixel circuits, at least some of the pixel circuits comprising:
a photodiode;
a floating diffusion region for receiving and storing charge from the photodiode; and
a transparent transistor for use in operation of the pixel, the transparent transistor being at least partially over the photodiode, such that the photodiode receives light passing through the transparent transistor; and
a readout circuit for reading out a signal based charges in the floating diffusion region.

36. The processing system of claim 35, wherein the transparent transistor comprises a transfer transistor, the transfer transistor operable to deliver stored charge from the photodiode to the floating diffusion region.

37. The processing system of claim 36, wherein the transfer transistor comprises first and second channel regions for passing charge through the transfer transistor.

38. The processing system of claim 35, wherein the transparent transistor comprises a reset transistor, the reset transistor operable to reset the floating diffusion region to a predetermined reset voltage state.

39. The processing system of claim 35, wherein the transparent transistor comprises a source follower transistor, the source follower transistor coupled to the floating diffusion region.

40. The processing system of claim 35, wherein the transparent transistor comprises a row select transistor, the row select transistor acting as a switching device coupled to a source follower transistor.

41. The processing system of claim 35, wherein the transparent transistor comprises an anti-blooming transistor for preventing charge overflow from the photo-conversion device.

42. The processing system of claim 35, wherein the transparent transistor comprises a storage gate transistor.

43. The processing system of claim 35, wherein the transparent transistor comprises a thin-film transistor.

44. The processing system of claim 35, wherein the transparent transistor comprises a transistor channel, the transistor channel comprising zinc-tin oxide.

45. The processing system of claim 44, wherein the transparent transistor further comprises a gate dielectric, the gate dielectric comprising aluminum oxide ($Al_2O_3$).

46. The processing system of claim 44, wherein the transparent transistor further comprises a gate dielectric, the gate dielectric comprising titanium oxide.

47. The processing system of claim 44, wherein the transparent transistor further comprises a gate dielectric, the gate dielectric comprising atomic layer deposition silicon dioxide (ALD $SiO_2$).

48. The processing system of claim 44, wherein the transparent transistor further comprises a gate electrode, the gate electrode comprising indium tin oxide.

49. The processing system of claim 35, wherein the photo-conversion device comprises a photodiode.

50. A pixel circuit comprising:
a photo-conversion device;
a floating diffusion region for receiving and storing charge from the photo-conversion device; and
a transistor for use in operation of the pixel, the transistor having at least a portion which transmits light within visible wavelengths of light, with no more than 10% scattering,
wherein the transistor is at least partially over the photo-conversion device, such that the photo-conversion device receives light passing through the transistor.

51. The pixel circuit of claim 50, wherein the portion of the transistor which transmits light is capable of transmitting light within visible wavelengths of light.

52. The pixel circuit of claim 50, wherein the portion of the transistor which transmits light is capable of transmitting light with no more than 10% scattering.

53. A pixel circuit comprising:

a photo-conversion device;

a floating diffusion region for receiving and storing charge from the photo-conversion device; and a transistor for use in operation of the pixel, the transistor having at least a portion which transmits light.

* * * * *

UNITED STATES PATENT AND TRADEMARK OFFICE
CERTIFICATE OF CORRECTION

PATENT NO. : 7,663,165 B2  Page 1 of 2
APPLICATION NO. : 11/513242
DATED : February 16, 2010
INVENTOR(S) : Chandra Mouli It is certified that error appears in the above-identified patent and that said Letters Patent is hereby corrected as shown below:

On the Title page,

[*] Notice:   Subject to any disclaimer, the term of this patent is extended or adjusted under 35 USC 154(b) by 587 days Delete the phrase "by 587 days" and insert -- by 756 days --

In the Specification:

Column 3, line 1, "The term 'transparent,' as used herein, to be understood as" should read --The term "transparent," as used herein, should be understood as--.

Column 4, lines 46-47, "The use of a transparent materials..." should read --The use of transparent materials--.

Column 4, lines 46-49, a "." is needed at the end of the sentence, "The use of [a] transparent materials for transfer transistor 219 allows transfer transistor 219 (FIG. 6) to be directly placed over at least a portion of photo-conversion device 214".

Column 6, line 48, "sensor having a array of pixels" should read --sensor having an array of pixels--.

Column 7, line 34, "the formation of an pnp-type pinned" should read --the formation of a pnp-type pinned--.

In the Claims:

Claim 4, line 8, "The pixel circuit of dam 2" should read --The pixel circuit of claim 2--.

Claim 18, lines 66-67, "the channel comprising zinc-fin oxide" should read --the channel comprising zinc-tin oxide--.

Signed and Sealed this

Twenty-seventh Day of July, 2010

David J. Kappos
*Director of the United States Patent and Trademark Office*

Claim 20, lines 16-17, "a readout circuit for reading out a signal based charges in the floating diffusing region" should read --a readout circuit for reading out a signal based on charges in the floating diffusing region--.

Claim 28, line 42, "comprises a tin-film transistor" should read --comprises a thin-film transistor--.

Claim 35, lines 7-8, "a readout circuit for reading out a signal based charges in the floating diffusing region" should read --a readout circuit for reading out a signal based on charges in the floating diffusing region--.

UNITED STATES PATENT AND TRADEMARK OFFICE
CERTIFICATE OF CORRECTION

PATENT NO. : 7,663,165 B2  Page 1 of 2
APPLICATION NO. : 11/513242
DATED : February 16, 2010
INVENTOR(S) : Chandra Mouli It is certified that error appears in the above-identified patent and that said Letters Patent is hereby corrected as shown below:

On the Title page,

[*] Notice: Subject to any disclaimer, the term of this patent is extended or adjusted under 35 USC 154(b) by 587 days Delete the phrase "by 587 days" and insert -- by 756 days --.

In the Specification:

Column 3, line 1, "The term 'transparent,' as used herein, to be understood as" should read -- The term "transparent," as used herein, should be understood as --.

Column 4, lines 46-47, "The use of a transparent materials..." should read -- The use of transparent materials --.

Column 4, lines 46-49, a "." is needed at the end of the sentence, "The use of [a] transparent materials for transfer transistor 219 allows transfer transistor 219 (FIG. 6) to be directly placed over at least a portion of photo-conversion device 214".

Column 6, line 48, "sensor having a array of pixels" should read -- sensor having an array of pixels --.

Column 7, line 34, "the formation of an pnp-type pinned" should read -- the formation of a pnp-type pinned --.

This certificate supersedes the Certificate of Correction issued July 27, 2010.

Signed and Sealed this

Twenty-fourth Day of August, 2010

David J. Kappos
*Director of the United States Patent and Trademark Office*

CERTIFICATE OF CORRECTION (continued)
U.S. Pat. No. 7,663,165 B2

In the Claims:

Column 8, Claim 4, line 8, "The pixel circuit of dam 2" should read -- The pixel circuit of claim 2 --.

Column 8, Claim 18, lines 66-67, "the channel comprising zinc-fin oxide" should read -- the channel comprising zinc-tin oxide --.

Column 9, Claim 20, lines 16-17, "a readout circuit for reading out a signal based charges in the floating diffusing region" should read -- a readout circuit for reading out a signal based on charges in the floating diffusing region --.

Column 9, Claim 28, line 42, "comprises a tin-film transistor" should read -- comprises a thin-film transistor --.

Column 10, Claim 35, lines 7-8, "a readout circuit for reading out a signal based charges in the floating diffusing region" should read -- a readout circuit for reading out a signal based on charges in the floating diffusing region --.